(12) United States Patent
Kang et al.

(10) Patent No.: US 6,755,229 B2
(45) Date of Patent: Jun. 29, 2004

(54) METHOD FOR PREPARING HIGH PERFORMANCE BALL GRID ARRAY BOARD AND JIG APPLICABLE TO SAID METHOD

(75) Inventors: Myung-Sam Kang, Daejeon (KR); Keon-Yang Park, Seoul (KR); Jang-Kyu Kang, Daejeon (KR)

(73) Assignee: Samsung Electro-Mechanics Co., Ltd., Kyunggi-do (KR)

(*) Notice: Subject to any disclaimer, the term of this patent is extended or adjusted under 35 U.S.C. 154(b) by 0 days.

(21) Appl. No.: 09/984,282

(22) Filed: Oct. 29, 2001

(65) Prior Publication Data

US 2003/0019574 A1 Jan. 30, 2003

(30) Foreign Application Priority Data

Jul. 27, 2001 (KR) ......................... 2001-45544

(51) Int. Cl.⁷ ............................ B32B 35/00; B23Q 3/00
(52) U.S. Cl. ..................... 156/556; 269/287; 269/288
(58) Field of Search ................ 269/287, 288; 156/556; 257/712, 717

(56) References Cited

U.S. PATENT DOCUMENTS 6,115,913 A * 9/2000 Yamasaki et al.

FOREIGN PATENT DOCUMENTS

| JP | 2-196452 | * | 8/1990 |
| JP | 05-235222 | * | 9/1993 |
| JP | 10-27813 | * | 1/1998 |
| JP | 10-116932 |   | 5/1998 |
| JP | 11-040934 | * | 2/1999 |
| JP | 2000-135559 | * | 5/2000 |

* cited by examiner

Primary Examiner—Melvin C. Mayes
(74) Attorney, Agent, or Firm—Morgan, Lewis & Bockius LLP

(57) ABSTRACT

Disclosed are a method for preparing a high performance BGA board and a jig applicable to the method. The method comprises pre-bonding an adhesive to a BGA board laminated structure or a heatsink by use of a jig; and main-bonding the BGA board laminated structure or the heatsink to which the adhesive is previously stuck in the pre-bonding step to the heatsink or the BGA board laminated structure, respectively, by use of a jig. A high performance BGA board can be prepared by use of an individual heatsink and a strip-type jig without a strip-type heatsink, and in which the Ni-plated side of the heatsink can be prevented from being contaminated.

2 Claims, 6 Drawing Sheets

METHOD FOR PREPARING HIGH PERFORMANCE BALL GRID ARRAY BOARD AND JIG APPLICABLE TO SAID METHOD

BACKGROUND OF THE INVENTION

1. Field of the Invention

The present invention relates, in general, to a method for preparing a high performance BGA (ball grid array) board and a jig applicable to the method, and in particular, to a method for preparing the high performance BGA board by use of an individual heatsink and a strip-type jig without a strip-type heatsink, in which the Ni-plated side of the heatsink can be prevented from being contaminated.

2. Description of the Prior Art

The great advance in the electronics industry is, at least in part, based on the development of the electronic parts industry. As electronic parts have been developed into slim ones of high performance, they can be more highly integrated in one board. To the development of electronic parts, multi-layer printed circuit boards make a contribution.

With the aim of mounting highly integrated electronic parts thereon, multi-layer printed circuit boards have a structure in which elemental boards having a plurality of circuits are laminated. Multi-layer printed circuit boards may have various forms, and be manufactured by various methods. However, conventional boards suffer from the disadvantage of not guaranteeing the full performance of high-speed IC chips because a large quantity of heat generated from I/O multifins of semiconductor chips cannot be effectively dissipated from the conventional boards, leading to a significant decrease in the transfer rate of electric signals.

To avoid the problem that conventional boards have, much effort has been made to manufacture boards that are of a high multi-layer structure and of excellent thermal stability. In the boards, semiconductor chips are bonded onto heatsinks while binding to bonding pads in the form of steps.

There are disclosed various methods for establishing heatsinks in printed circuit boards. For example, Japanese Patent Publication No. Hei. 10-116933 discloses a multi-layer printed wiring board for mounting IC, in which a heatsink is fixed firmly on a laminated structure by soldering, with IC being fixed firmly on the heatsink by use of a resin adhesive. Furthermore, Japanese Patent Publication No. Hei. 10-116932 discloses a method for preparing a multi-layer printed wiring board for mounting IC, in which a multilayered BGA is heated at 200° C. for 1 hour to prevent the board from being bent, followed by heating the BGA in a reflow furnace to cure a thermosetting resin adhesive, thereby fixing a heatsink onto the board. Heatsinks used in the above methods are prepared by plating copper foil with Ni and then with platinum.

Generally, a BGA board equipped with a heatsink is manufactured by bonding individual BGA boards to a strip-type heatsink that is blackened at the side onto which the BGA board is bonded, with the other side being plated with Ni. A detail description will be given of the manufacture of a heatsink-equipped BGA board in conjunction with FIG. 1. With reference to FIG. 1a, there is illustrated the pre-bonding of a BGA 5 to a heatsink 3 through an adhesive 2. To this end, the adhesive 2 is coated on the heatsink 3, followed by the application of heat and pressure by use of a hot steel plate 1. In this regard, a jig 4 is employed to accurately apply the adhesive 2 to a defined part of the heatsink 3. Thereafter, main-bonding is accomplished by pressing an individual BGA 5 against the resulting structure obtained from the pre-bonding step, with a provision of heat by use of a hot steel plate 6, as shown in FIG. 1b. The heatsink-equipped, strip-type BGA board thus obtained is shown in a plane view in FIG. 2.

When a heatsink is bonded to a BGA board as described above, there are generated problems, including contamination of the Ni-plated side, poor bonding reliability, and inapplicability of individual heatsinks.

Furthermore, Japanese Patent Publication No. Hei. 10-178122 discloses an IC mounting multilayer printed wiring board which causes no breaking of wire resulting from cracking in an inner layer conductor wire. In the IC mounting multilayer printed wiring board constituted by laminating a plurality of resin substrates, the coating plated at the wall of a through hole is 8–35 $\mu$m thick while a conductor wire spatially distant from an external lead pin by the coating plated in the through hole is 25–70 $\mu$m thick, thereby preventing the wire breaking caused by the cracking at the plated coating of the through hole and at the conductor wire. The IC mounting multilayer printed wiring board, however, suffers from the disadvantage of being out of the permitted range of thickness deviation or being distorted.

Therefore, there remains a need for a method that can be used to laminate individual heatsinks and can prevent the distortion of multilayer printed wiring boards when a BGA board is bonded to the heatsink.

SUMMARY OF THE INVENTION

It is therefore an object of the invention to avoid disadvantages encountered in the prior art, and provide a method for preparing the high performance BGA board which enjoys the advantages of using individual heatsinks, preventing the Ni-plated side of the heatsink from being contaminated and damaged, and having a reliable bonding state.

It is another object of the present invention to provide a method for preparing the high performance BGA board which enjoys the advantage of preventing BGA boards from being deviated in thickness from the permitted range and distorted upon bonding.

It is further object of the present invention to provide a jig applicable to the method for preparing a high performance BGA board.

These objects can be accomplished by providing a method for preparing a high performance BGA board, comprising the steps of:

a) providing an individual BGA board laminated structure;

b) providing an individual heatsink for dissipating heat of the BGA board laminated structure;

c) pre-bonding an adhesive layer to the BGA board laminated structure or the heatsink by use of a pre-bonding jig; and d) main-bonding the BGA board laminated structure or the heatsink, to which the adhesive layer is previously stuck in the c) step, to the corresponding heatsink or the BGA board laminated structure, respectively, by use of a main-bonding jig.

To accomplish above objects, another method for preparing a high performance BGA board according to the invention may be provided, the method comprising the steps of:

a) providing an individual BGA board laminated structure;

b) providing an individual heatsink for dissipating heat of the BGA board laminated structure;

c) pre-bonding which comprises establishing a first set of pins for arranging the BGA board laminated structure on a pre-bonding jig of a strip-type, placing the BGA board laminated structure onto the pre-bonding jig under the guidance of the first set of pins, forming an adhesive layer covered with a cover sheet on the BGA board laminated structure in a pattern fitting to the heatsink followed by removing the cover sheet from the adhesive layer, attaching the heatsink to a flexible tape and then arranging the flexible tape-attached heatsink on the adhesive layer with the flexible tape being locked by a second set of pins established onto the pre-bonding jig, and lightly bonding the heatsink to the BGA board under pressure;

d) separating a resulting pre-bonded structure consisting of the BGA board laminated structure, the adhesive layer and the heatsink therefrom; and e) main-bonding the pre-bonded structure using a main-bonding jig under pressure at a high temperature.

Furthermore, the objects of the invention can be accomplished by a jig for combining a heatsink with a BGA board laminated structure via an adhesive layer, the jig consisting of an upper and a lower plate to form a cavity, wherein the cavity is so defined that the BGA board laminated structure, the adhesive layer and the heatsink are arranged to precisely combine one another, and wherein the total thickness of the jig is smaller than that of the combination of the BGA board laminated structure, the adhesive and the heatsink by 20 to 40 µm.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE INVENTION

A better understanding of the present invention may be obtained with reference to the accompanying drawings, which are not to be construed to limit the present invention.

According to the present invention, a BGA board with high performance is prepared as follows:

An individual BGA board laminated structure is prepared by laminating a plurality of boards in which conductor circuits for electrically connecting electronic part, and cavities are formed, and then by forming printed circuits through plating, etching, developing and routing. Thereafter, an individual heatsink for dissipating heat of the BGA board laminated structure is bonded to the individual BGA board laminated structure through pre-bonding and main-bonding.

Figure 1A:
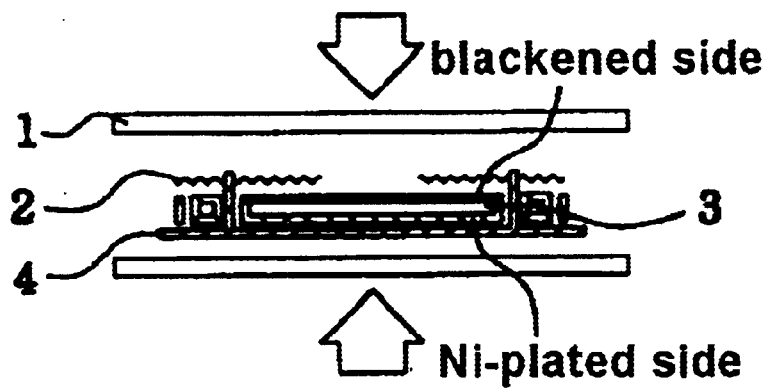
FIGS. 1a and 1b are cross sectional views illustrating conventional pre-bonding and main-bonding in case of bonding a heatsink to a BGA, respectively.
Figure 1B:
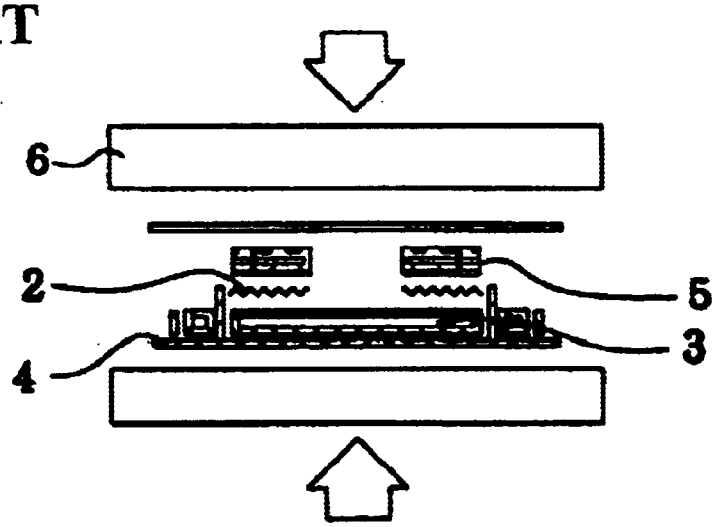
Figure 2:
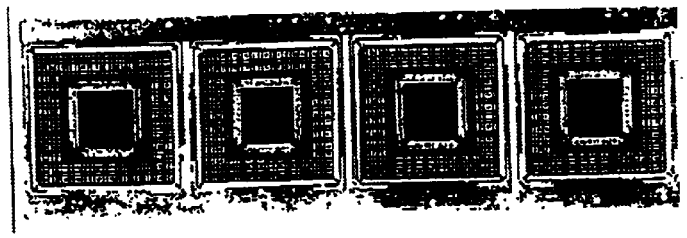
FIG. 2 is a plan view of a BGA bonded to a heatsink of strip-type according to prior arts.
Figure 3:
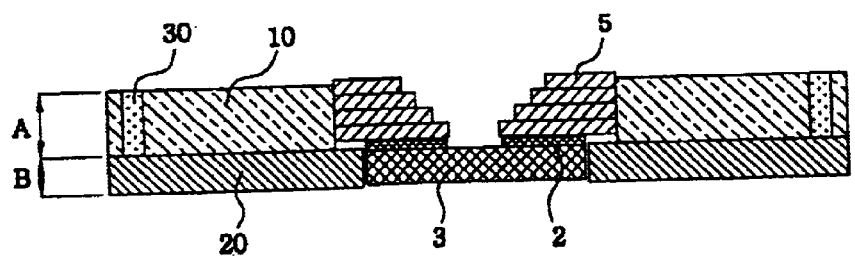
FIG. 3 is a cross sectional view illustrating main-bonding step using a jig in accordance with the present invention.
Figure 4:
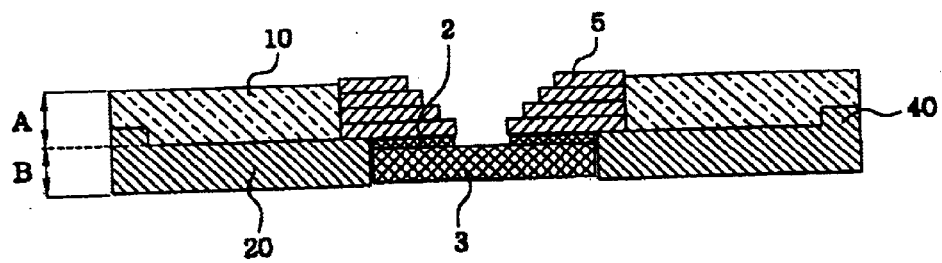
FIG. 4 is a cross sectional view illustrating main-bonding step using another type of jig in accordance with the present invention.

With reference to FIGS. 3 to 10, there is shown a method for manufacturing a high performance BGA board in accordance with one embodiment of the present invention. For example, this method comprises a pre-bonding step in which an adhesive layer is applied on an individual heatsink or an individual BGA board (FIGS. 5 to 10) and a main-bonding step in which the adhesive layer-applied heatsink or BGA board is bonded to the corresponding BGA board laminated structure or heatsink by use of a main-bonding jig (FIGS. 3 and 4).

FIGS. 3 and 4 are cross sectional views illustrating the step of main-bonding pre-bonded structure consisting of the BGA board laminated structure 5, the adhesive layer 2 and the heatsink 3 using a main-bonding jig consisting of an upper 10 and a lower plate 20.

FIG. 3 illustrates an embodiment using a set of guide pins 30 to precisely fix the upper plate 10 to the lower jig 20 while FIG. 4 illustrates an embodiment using a set of grooves 40 to precisely fix the main-bonding jig.

The main-bonding jig useful in the present invention consists of an upper and a lower plate to form a cavity. The cavity is so defined that the BGA board laminated structure 5, the adhesive layer 2 and the heatsink 3 are arranged to precisely combine one another. The total thickness of the jig is smaller than that of the combination of the BGA board laminated structure, the adhesive layer and the heatsink by 20 to 40 µm to obtain an optimum bonding result. The upper and lower plates 10 and 20 may be made of stainless steel or rigid epoxy resin. To this end, when the thickness B of the lower plate 20 is identical to that of the heatsink (See FIG. 3) or to that of the heatsink plus the adhesive layer (See FIG. 4), the total thickness of the jig may be made to fall within the range by controlling the thickness A of the upper plate 10. Thus, the jig is set to press the BGA board to such a predetermined thickness that may avoid the damage of the BGA board.

Further, in order to prevent the upper plate 10 from swerving from the lower plate 20, the jig is provided with the set of guide pins 30 as in FIG. 3 or with the set of grooves 40 as in FIG. 4. Another advantage of the present invention is that the board can be prevented from being distorted during the main-bonding step by using the jig as above.

Turning now to FIGS. 5 to 14, there is illustrated embodiments of the pre-bonding step in which an individual heatsink and an adhesive layer are bonded to each other according to the present invention.

Figure 5:
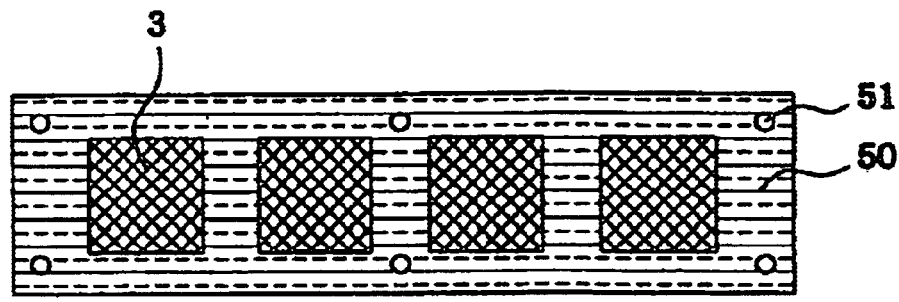
FIG. 5 is a plan view illustrating a heatsink bonded to a pre-bonding jig of strip-type useful in the pre-bonding step according to the present invention.
Figure 6:
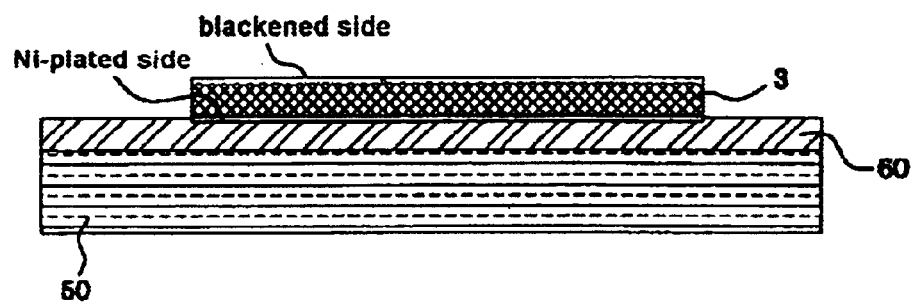
FIG. 6 is a cross sectional view of FIG. 5.

FIGS. 5 and 6 show one embodiment of the pre-bonding step in a plan and a cross-sectional view, respectively. As seen in these figures, a dust-free, double sided tape 60 is coated on a pre-bonding jig of strip-type 50 and the individual heatsink 3 is placed onto the dust-free double sided tape 50 in such a way that the Ni-plated side is brought into contact with the double sided tape 60, after which an adhesive layer is applied to the blackened side of the individual heatsink 3. As shown in FIG. 6, prior to the attachment of the individual heatsinks 3, the dust-free, double sided tape 60 is applied in such a way that the jig is not contaminated with the resin of the adhesive tape. Subsequently, the Ni-plated side of the heatsink is bonded to the jig via the double sided tape. Accordingly, the Ni-plated side can be prevented from being contaminated and damaged when the heatsink is separated from the jig. Then, the pre-bonding is carried out under high pressure at a high temperature. Thus, a BGA of strip-type as in FIG. 5 can be produced using the individual heatsinks.

Figure 7:
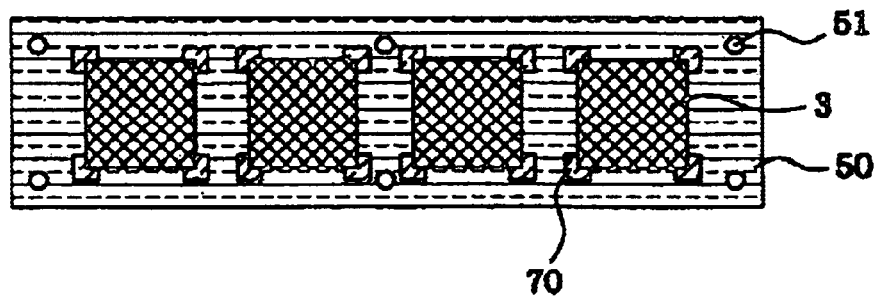
FIG. 7 is a plan view illustrating a heatsink bonded to another pre-bonding jig of strip-type useful in the pre-bonding step according to the present invention.
Figure 8:
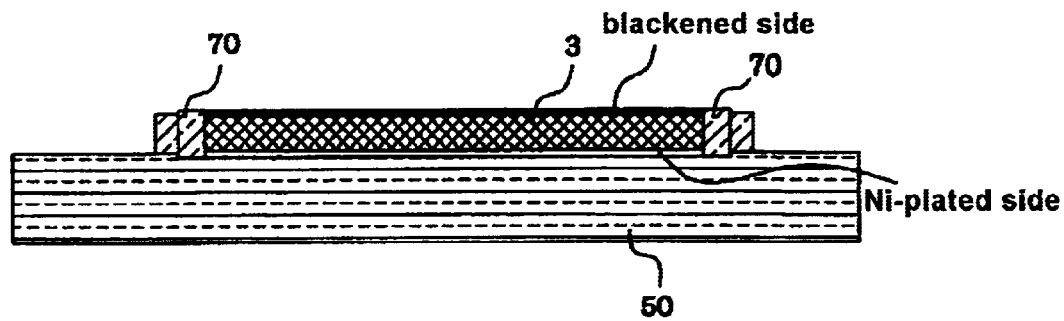
FIG. 8 is a cross sectional view of FIG. 7.

FIGS. 7 and 8 show the pre-bonding step in a plan and a cross-sectional view, respectively, in accordance with another embodiment of the present invention. As seen in these figures, the heatsink 3 is fixed onto the jig of strip-type without a dust-free, double sided tape, but with the aid of a set of guide sides 70 established at the outer side of the heatsink in such a way that the Ni-plated side is brought into contact with the pre-bonding jig 50, after which an adhesive layer is applied to the blackened side of the individual heatsink 3 and the pre-bonding is carried out under high pressure at a high temperature. In this method, a BGA of strip-type may be prepared using individual heatsinks without the contamination and damage of the nickel-plated side of the heatsink 3 since an adhesive tape is not employed.

Figure 9:
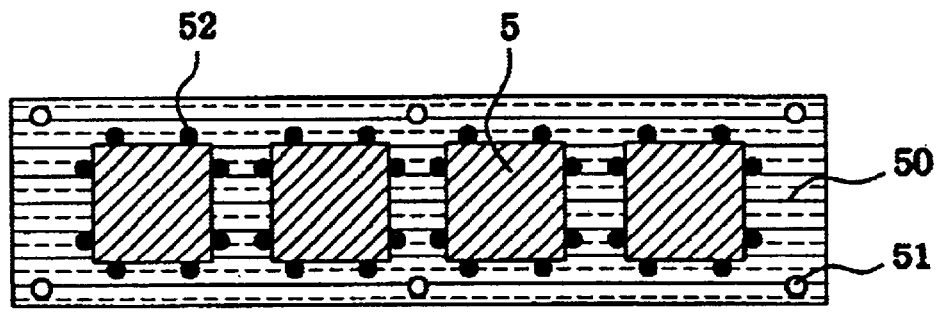
FIG. 9 is a plan view illustrating a BGA positioned on a pre-bonding jig of strip-type useful in pre-bonding step according to one embodiment of the present invention.
Figure 10:
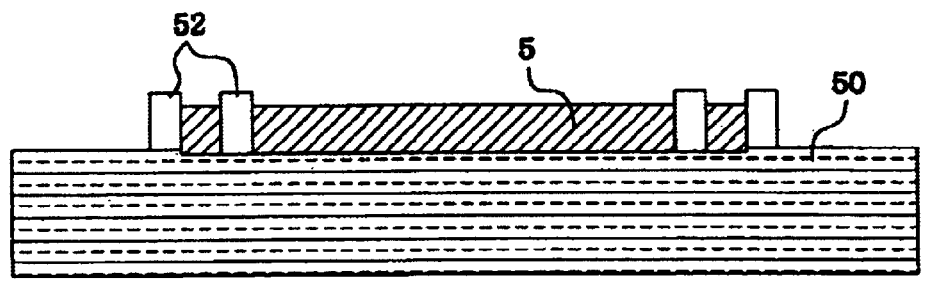
FIG. 10 is a cross sectional view of FIG. 9.

Referring to FIGS. 9 and 10, there is shown a pre-bonding step in a plan and a cross-sectional view, respectively, in accordance with a further embodiment of the present invention. Unlike the pre-bonding steps illustrated in FIGS. 5 to 8, in which an adhesive layer is applied to a heatsink, the pre-bonding step of this embodiment is characterized in that an adhesive layer is applied to a BGA board, followed by conducting a main-bonding process of bonding the BGA board to a heatsink. As seen in FIGS. 9 and 10, a set of BGA-fixing pins 52 are used to arrange BGA boards 5 on a pre-bonding jig 50. When the BGA board 5 is primarily fixed onto the pre-bonding jig 50, the BGA board 5 is positioned in such a way that the side for mounting the heatsink is directed upward.

With reference to FIGS. 11 to 14, there is shown a method for manufacturing a high performance BGA board in accordance with another embodiment of the present invention. This method is composed of a pre-bonding step and a main-bonding step. At that time, an individual BGA board laminated structure and a heatsink, respectively is provided prior to the pre-bonding step and main-bonding step.

The pre-bonding step comprises establishing a first set of pins for arranging the BGA board laminated structure on a pre-bonding jig of a strip-type, placing the BGA board laminated structure onto the pre-bonding jig under the guidance of the first set of pins, forming an adhesive layer covered with a cover sheet on the BGA board laminated structure in a pattern fitting to the heatsink followed by removing the cover sheet from the adhesive layer, attaching the heatsink to a flexible tape and then arranging the flexible tape-attached heatsink on the adhesive layer with the flexible tape being locked by a second set of pins established onto the pre-bonding jig, and lightly bonding the heatsink to the BGA board under pressure.

After a resulting pre-bonded structure consisting of the BGA board laminated structure, the adhesive layer and the heatsink is separated therefrom, the main-bonding step is carried out.

In the main-bonding step, the pre-bonded structure is the pre-bonded structure is firmly bonded using the aforementioned main-bonding jig under pressure at a high temperature.

Figure 13:
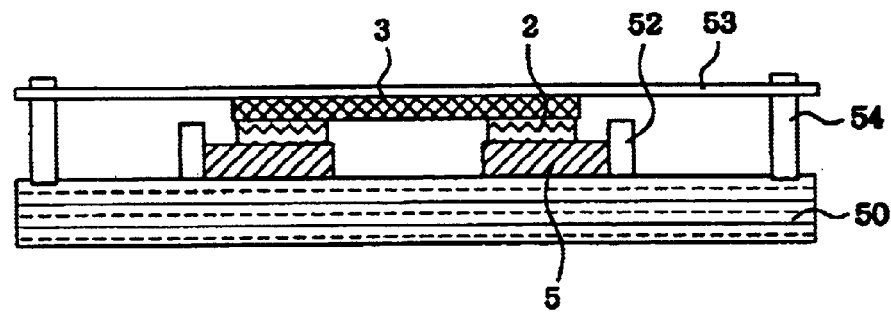
FIG. 13 is a cross sectional view illustrating one embodiment of a pre-bonding step according to the present invention, in which a BGA board laminated structure, an adhesive layer and a heatsink are lightly bonded to one another.

A more detailed description is given of the pre-bonding step in FIG. 13. FIG. 13 is a cross sectional view of the BGA board after the pre-bonding step is completed, in which a BGA board laminated structure 5 is fixed onto a pre-bonding jig 50 of strip-type by use of a first set of pins 52, an adhesive layer 2 covered with a cover sheet 55 is coated on the BGA board laminated structure in a pattern fitting to the heatsink, and then the cover sheet 55 is removed therefrom. Next, the heatsink 3 is attached to a flexible tape 53 and then is arranged on the adhesive layer 2 with the unattached face of the heatsink 3 being directed toward the adhesive layer 2. At this time, parts of the flexible tape 53, to which the heatsink 3 is not attached, is locked by such a second set of pins 54 established on the pre-bonding jig 50 that the heatsink can be fixed precisely on the adhesive layer 2. Thereafter, the heatsink 3 is lightly bonded to the BGA board laminated structure 5 via the adhesive layer 2 under pressure. In the above step, the surface of the jig should be cleaned when the BGA board laminated structure 5 is positioned on the jig 50. Also, the height of the pins 54, which serve to fix the heatsink 3 precisely on the adhesive layer 2, should be lightly higher than that of the BGA board laminated structure 5.

After the pre-bonding step as above, the pre-bonded structure consisting of the BGA board laminated structure, the adhesive layer and the heatsink is separated. As described above, the pre-bonded structure is inserted into the cavity formed in a main-bonding jig consisting of an upper plate and a lower plate. The main-bonding step is carried out under pressure at a high temperature. As a result of the main-bonding, the BGA board laminated structure, the adhesive layer and the heatsink is combined with one another firmly and precisely.

Figure 11:
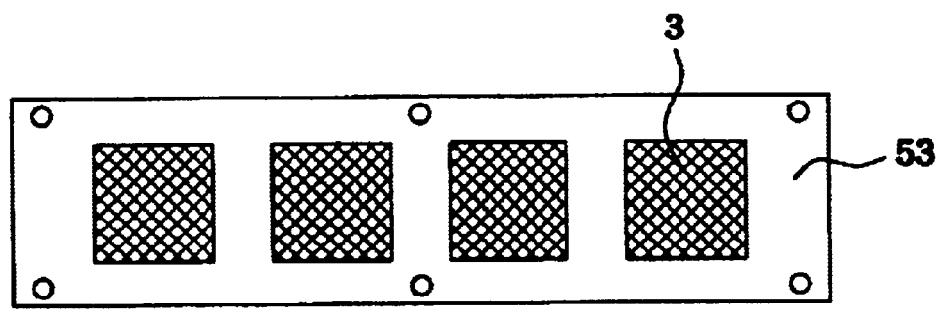
FIG. 11 is a plan view illustrating a heatsink positioned on a flexible tape of strip-type according to another embodiment of the present invention.
Figure 12:
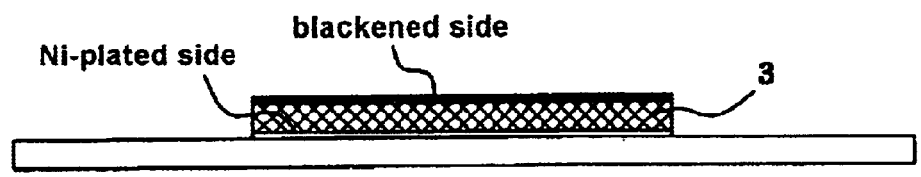
FIG. 12 is a cross sectional view of FIG. 11.

As for the flexible adhesive tape 53, it has a strip form, on which heatsinks 3 are arranged, as shown in FIG. 11. Also, the flexible tape 53 of strip-type has holes in such positions that the arranged heatsinks match the jig when the pins 54 are engaged with the holes. Furthermore, the Ni-plated side of the heatsink 3 is positioned to direct toward the flexible tape 53 is attached to the Ni-plated side of the heatsink 3, while the blackened side faces the BGA board, as shown in FIG. 12.

Generally, the heatsink is made of copper foil. The elemental boards of the BGA board laminated structure are preferably made of glass epoxy resin because its coefficient of thermal expansion is similar to that of copper which is a material of the conductor circuits fabricated on the board, in order to prevent the conductor circuits from being separated. Therefore, it is preferred that the heatsink is prepared from copper foil for the same reason. Alternatively, an aluminum plate may also be used, which can dissipate heat with high efficiency. Another alternative is a stainless steel plate which is highly resistant to corrosion. A Ni-plated layer is formed to a thickness of 2 to 10 μm on the copper foil by electrolytic plating. Then, acidic components which are produced during the electrolytic plating are rinsed off, and the surface is blackened in order to improve the adhesiveness between the surface and the board.

Figure 14:
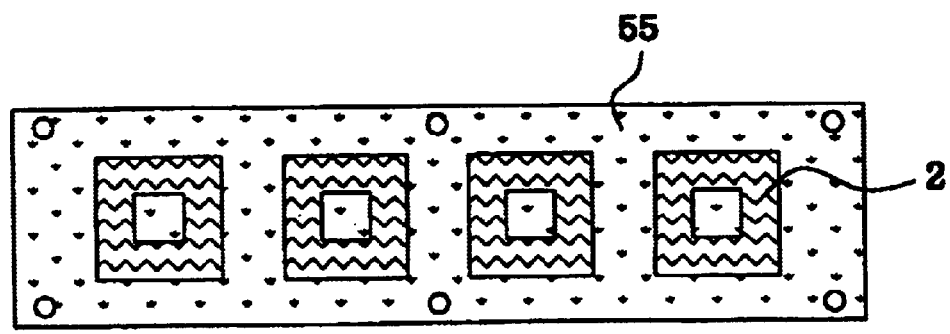
FIG. 14 is a plan view illustrating an adhesive layer positioned on a cover sheet, which is employable in the pre-bonding step of the present invention.
Figure 15:
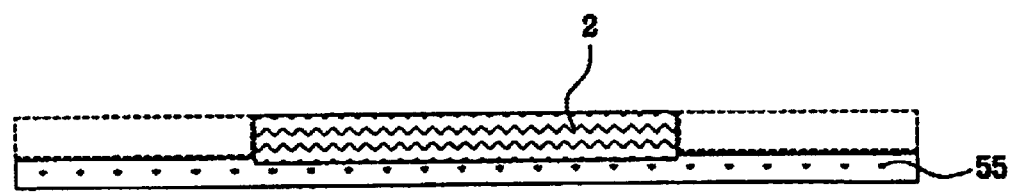
FIG. 15 is a cross sectional view of FIG. 14 illustrating an adhesive layer positioned on a cover sheet.

FIGS. 14 and 15 show the adhesive layer 2 applied to the method of the present invention, in a plan and a cross sectional view, respectively. As seen in these figures, the adhesive layer 2 is formed in the same pattern as in the heatsink while being covered with a cover sheet 55. In FIG. 15, the dotted line represents a part of the adhesive, which does not need to be bonded to products and thus is to be removed.

In addition, the adhesive layer 2 suitable for use in the present invention may be a film-typed adhesive sheet obtained by combining a rubber such as NBR, acryl resin, polyvinylbutyral resin, phenol resin, etc. with prepreg or epoxy resin, and preferably obtained by combining polyvinylbutyral resin of low fluidity, acrylic resin and phenol resin. Furthermore, the material of the adhesive layer may preferably be the same as that of the board. For example, prepreg in which glass epoxy is deposited may be used in the case of a glass epoxy resin board.

Therefore, HP-BGA may be prepared through a pre-bonding step comprising positioning the BGA board 5 on the jig 50, forming the adhesive layer 2 on the BGA board 5, removing the cover sheet 55, bonding the heatsink 3 to the BGA board via the adhesive layer, and applying heat and pressure as shown in FIG. 13; and a main-bonding comprising firmly bonding the resulting structure consisting of the BGA board laminated structure, adhesive layer and heatsink.

As described above, a method for preparing the HP-BGA according to the invention enjoys the advantages of using individual heatsinks, preventing the Ni-plated side of the heatsink from being contaminated and damaged, and obtaining a reliable bonding state. Another advantage of the method of the present invention is that the BGA boards can be prevented from deviating in thickness from the permitted range and being distorted upon bonding.

Many modifications and variations of the present invention are possible in light of the above teachings, and the present invention will be more clearly understood from the appended claims.

What is claimed is:

1. A jig for combining a heatsink with a BGA board laminated structure via an adhesive layer, the jig consisting of an upper plate and a lower plate with a cavity formed through the upper plate and lower plate, wherein the cavity is so defined that the BGA board laminated structure, the adhesive layer and the heatsink are arranged to precisely combine one another, and wherein the upper plate and the lower plate of said jig are fixed with each other by a set of guide pins.

2. A jig for combining a heatsink with a BGA board laminated structure via an adhesive layer, the jig consisting of an upper plate and a lower plate to form a cavity, wherein the cavity is so defined that the BGA board laminated structure, the adhesive layer and the heatsink are arranged to precisely combine one another, and wherein the upper plate and the lower plate of said jig are fixed with each other by a set of grooves.

* * * * *